United States Patent [19]

Yamamoto et al.

[11] Patent Number: 5,171,785
[45] Date of Patent: Dec. 15, 1992

[54] FILM FOR PELLICLE

[75] Inventors: Takashi Yamamoto, Ebina; Katsuya Shibata, Tokyo; Tatsuki Suzuki, Kawasaki; Toru Seita, Atsugi, all of Japan

[73] Assignee: Tosoh Corporation, Yamaguchi, Japan

[21] Appl. No.: 712,154

[22] Filed: Jun. 10, 1991

[30] Foreign Application Priority Data

Jun. 12, 1990 [JP] Japan .................. 2-151589
Nov. 29, 1990 [JP] Japan .................. 2-325272

[51] Int. Cl.$^5$ .............................. C08F 8/00
[52] U.S. Cl. ........................ 525/61; 525/60; 525/340; 525/363; 525/371; 525/367
[58] Field of Search ............ 525/60, 61, 340, 363, 525/367, 371

[56] References Cited

U.S. PATENT DOCUMENTS 4,499,231  2/1985  Ward et al. ................. 524/506
4,513,117  4/1985  Fries ........................... 525/60

*Primary Examiner*—Joseph L. Schofer
*Assistant Examiner*—J. M. Reddick
*Attorney, Agent, or Firm*—Nixon & Vanderhye

[57] ABSTRACT

A pellicle film comprised of a resin prepared by reducing a polyvinyl acetal of the formula:

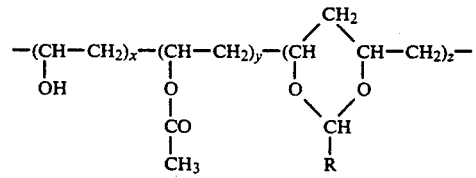

wherein R is a C1-3 alkyl group and the vinyl acetate content "$y/(x+y+z)$" is not larger than 0.1 and the degree of acetalization "$z/(x+y+z)$" is at least 0.6. This pellicle film exhibits a reduced UV absorption in the vicinity of 365 nm and is durable against irradiation with UV rays, especially i-line of a mercury arc light.

5 Claims, 5 Drawing Sheets

FILM FOR PELLICLE

BACKGROUND OF THE INVENTION

(1) Field of the Invention

This invention relates to a film for a pellicle which is used as a dust cover for a photomask or reticle (which is hereinafter referred to as "mask" for brevity) used at the lithographic step in the course for the production of a semiconductor integrated circuit.

The film for a pellicle of the present invention can also be used in lithography utilizing as a light source i-line having a wavelength of 365 nm of a mercury arc light, which is recently used.

(2) Description of the Related Art

In the production of a semiconductor integrated circuit, the step of patterning by light exposure a semiconductor wafer coated with a resist material is important because it dominates the yield of the integrated circuit. If scratches or dusts are present on a mask which is an original sheet for patterning, the images of the scratches or dusts as well as those of the intended pattern are transferred onto the wafer and consequently shortcircuiting or wiring breakage occasionally occurs in the integrated circuit. Therefore, protection of the mask is important for enhancing the yield of the integrated circuit and a pellicle is now often used as a dust cover for protection of the mask.

As pellicle film-forming materials, nitrocellulose, cellulose acetate, cellulose propionate, polyethylene terephthalate, polypropylene and polymethyl methacrylate have heretofore been proposed. Of these, nitrocellulose is used as a pellicle film in a light exposure apparatus utilizing g-line (wavelength: 436 nm) of a mercury arc light as the light source.

Recently, the demand for high densification of a semiconductor integrated circuit requires shortening of the wavelength in lithography light source, and thus, the i-line having a wavelength shorter than that of the g-line is used as the lithography light source, as well as the conventional g-line.

Conventional pellicle film-forming materials such as nitrocellulose can be used in the lithography using as the light source near ultraviolet rays such as g-line and h-line of a mercury arc light, but cannot advantageously used in a light exposure apparatus using i-line of a mercury arc light, as the lithography light source. This is because the conventional pellicle film-forming materials exhibit a light absorption in the deep ultraviolet region, and therefore, rapidly become opaque or are deteriorated when exposed to the i-line. Therefore, a pellicle film is now eagerly desired which can advantageously be used for i-line as well as g-line or h-line of a mercury arc light.

The following are usually required for a film for a pellicle: (1) the pellicle film does not exhibit a light absorption, i.e., is transparent, in the wavelength region of the light source of the light exposure apparatus, and (2) the pellicle film is durable, that is, even when the pellicle is continuously exposed to light for a long time, it does not become opaque nor is deteriorated. When the pellicle film is used in a light exposure apparatus using i-line of a mercury arc light as the light source, it is required that the pellicle film is transparent to and durable against the i-line.

As a film for a pellicle used in a light exposure apparatus utilizing the i-line as the light source, a pellicle film having a multilayer structure has been proposed which is comprised of a nitrocellulose film having reflection-preventing layers composed of a fluorine-containing polymer on both surfaces thereof (for example, see Japanese Unexamined Patent Publication No. H1-100549). The process for preparing this pellicle film is complicated, the yield is low and the production is costly.

As another pellicle film used in a light exposure apparatus utilizing i-line of a mercury arc light, a pellicle film comprised of a polyvinyl acetal resin has been proposed (for example, see Japanese Unexamined Patent Publication No. H1-172430). The polyvinyl acetal resin pellicle film can be used without reflection-preventing layers and the production thereof is neither complicated nor costly, but this pellicle film is not durable, that is, when exposed to the i-line for a long period, it becomes opaque and is deteriorated.

SUMMARY OF THE INVENTION

Under the above-mentioned background, a primary object of the present invention is to provide a film for a pellicle which can be used without reflection-preventing layers in a light exposure apparatus utilizing i-line of a mercury arc light as the light source and is durable, that is, does not become opaque nor is deteriorated even when exposed to the i-line for a long time.

In accordance with the present invention, there is provided a film for a pellicle consisting essentially of a resin prepared by reducing a polyvinyl acetal resin represented by the following formula (1):

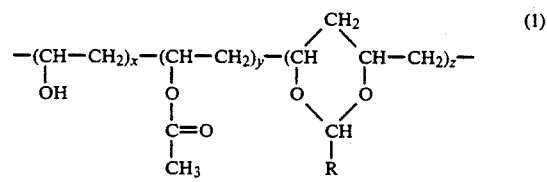

wherein R is a linear or branched alkyl group having 1 to 3 carbon atoms, and x, y and z are numbers such that the content of the vinyl acetate units, expressed by $y/(x+y+z)$, is not larger than 0.1 and the degree of acetalization, expressed by $z/(x+y+z)$, is at least 0.6.

DESCRIPTION OF THE PREFERRED EMBODIMENTS

Figure 1:
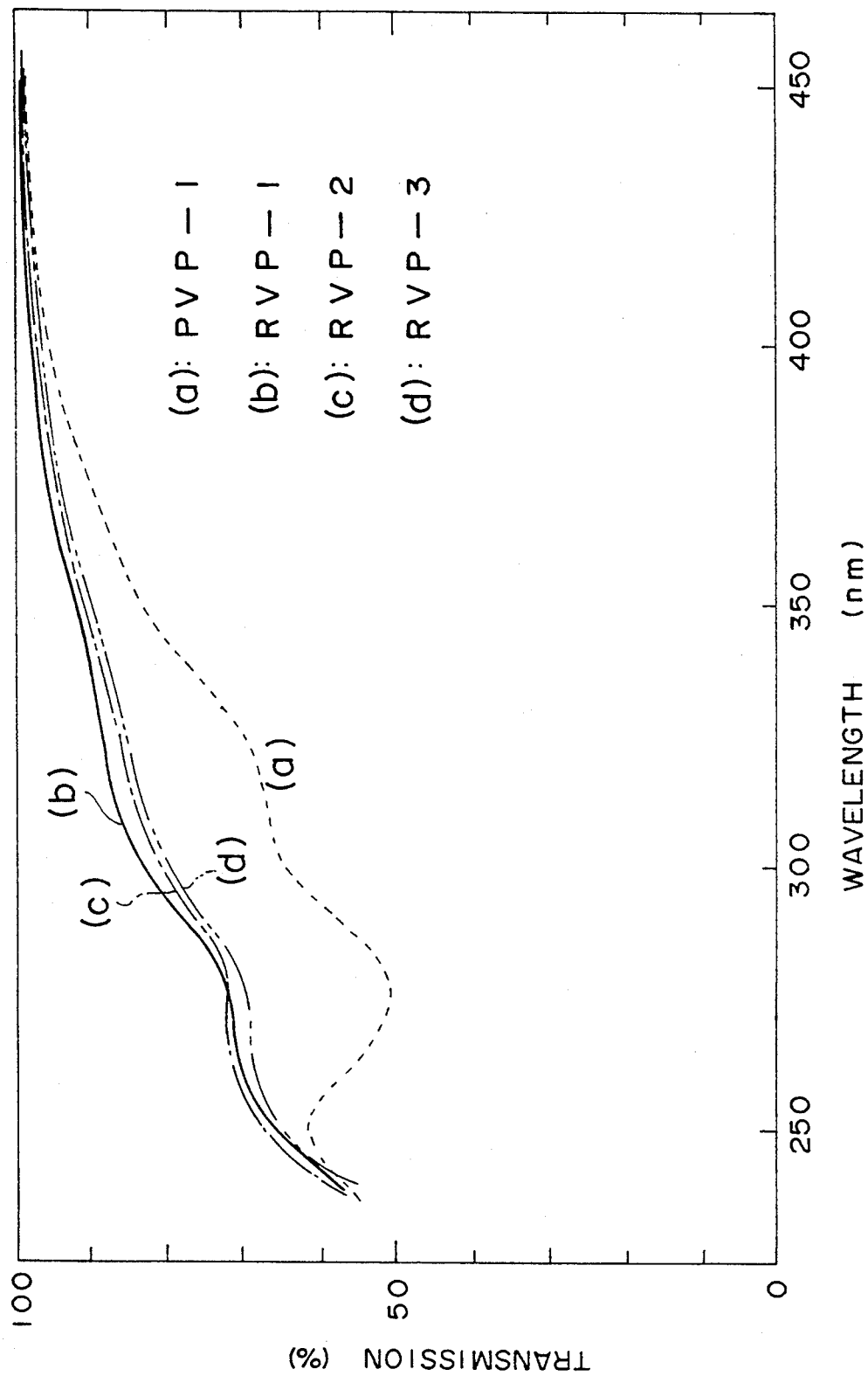
FIG. 1 shows ultraviolet transmissions of reduced polyvinyl propional resins prepared in Synthesis Examples 2, 3 and 4, and that of an untreated polyvinyl propional resin prepared in Synthesis Example 1.

The reduced polyvinyl acetal resin used in the present invention is prepared from a polyvinyl acetal resin represented by the following formula (1):

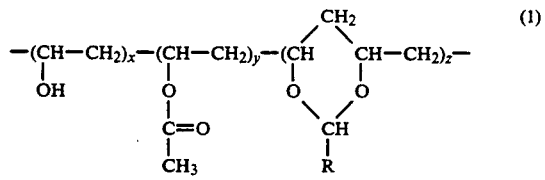

wherein R is a linear or branched alkyl group having 1 to 3 carbon atoms such as methyl, ethyl, n-propyl and isopropyl group, and x, y and z are numbers such that the content of the vinyl acetate units, expressed by $y/(x+y+z)$, is not larger than 1.0 and the degree of acetalization, expressed by $z/(x+y+z)$, is at least 0.6.

The polyvinyl acetal resin of the formula (1) is prepared by a known condensation reaction between polyvinyl alcohol and an aldehyde such as acetaldehyde, propionaldehyde, n-butyl aldehyde or sec-butyl aldehyde. For example, an aldehyde and an acid catalyst such as sulfuric acid or hydrochloric acid are simultaneously added into a solution of polyvinyl acetate in a solvent such as methanol, ethanol or acetic acid whereby saponification and acetalization of the polyvinyl acetate are concurrently effected. Alternatively, polyvinyl alcohol is dissolved or dispersed in water or an alcohol such as methanol, ethanol, n-propyl alcohol or iso-propyl alcohol, or a water/alcohol mixture; the above-mentioned aldehyde and acid catalyst are added to the solution or dispersion of polyvinyl alcohol whereby the condensation of polyvinyl alcohol with an aldehyde is effected. The latter method employing polyvinyl alcohol as a starting material is preferable because the resulting resin exhibits a good transparency and it is easy to control the molecular weight of the resin and also control the content of the vinyl acetate units in the resin. The control of the content of the vinyl acetate units in the resulting polyvinyl acetal resin is effected by varying the content of the vinyl acetate units in the starting polyvinyl alcohol. By varying the charge ratio of polyvinyl alcohol to an aldehyde, the reaction time, the reaction temperature and the amount of the catalyst, the degree of acetalization of the polyvinyl acetal resin can be controlled.

The content of the vinyl acetate units in the polyvinyl acetal resin, expressed by $y/(x+y+z)$, is not larger than 0.1, preferably not larger than 0.01 and more preferably not larger than 0.005. The degree of acetalization of the polyvinyl acetal resin, expressed by $z/(x+y+z)$, is at least 0.6. If the content of the vinyl acetate units and the degree of acetalization do not satisfy these requirements, the pellicle becomes difficult to release from a substrate at the pellicle film-forming step and irreversible elongation or fogging occur at the step of washing the pellicle film with water for removing dust.

The weight average molecular weight of the polyvinyl acetal resin, as determined by the gel permeation chromatography using monodisperse polystyrene as the reference material, is preferably in the range from 10,000 to 300,000. Where the weight average molecular weight is outside this range, the pellicle film has a poor uniformity and mechanical strength.

The reduced polyvinyl acetal resin used in the present invention is prepared by reducing the polyvinyl acetal resin of the formula (1). As the reduction method, there can be mentioned (a) a method using a metal hydride complex, (b) a catalytic hydrogenating reduction method using a metal catalyst, and (c) a method using a solution of an alkali metal in an amine.

As the metal hydride complex used as the reducing agent in the method (a), there can be mentioned lithium aluminum hydride, sodium aluminum hydride, sodium borohydride, lithium borohydride, $NaBH_4$—$AlCl_3$, $NaBH_4$—$BF_3$, $LiAl(O-t-Bu)_3$, $NaAlH_2(OCH_2CH_2OCH_3)_2$, $NaBH(OCH_3)_3$ and $LiBH(sec-Bu)_3$. These reducing agents can be used alone or in combination. Of these reducing agents, lithium aluminum hydride is preferable because this compound has a strong reducing power and is inexpensive and readily commercially available.

The method (a) of reducing the polyvinyl acetal of the formula (1) using the metal hydride complex is specifically described in the following with reference to the use of lithium aluminum hydride.

The polyvinyl acetal resin of the formula (1) is reduced in the form of a solution in an ether solvent or in the state of being swollen with an ether solvent. The ether solvent includes, for example, tetrahydrofuran (THF), diethyl ether, di-n-propyl ether, di-n-butyl ether and 1,4-dioxane. The lithium aluminum hydride catalyst is dispersed in the ether solvent and the catalyst dispersion is incorporated with the dissolved or swollen polyvinyl acetal thereby to effect reduction. The amount of the lithium aluminum hydride is in excess of the equivalent amount necessary for reducing the carbonyl groups in the polyvinyl acetal resin. The ether solvent must be preliminarily dehydrated and purified. The reduction can be carried out at a temperature of from room temperature to the reflux temperature. The reaction time is at least one hour, although the suitable reaction time varies depending upon the reaction temperature.

After completion of the reaction, water is added to the reaction mixture and thereafter the reduced resin is extracted with an organic solvent. The organic solvent includes, for example, methylene chloride, chloroform, carbon tetrachloride, benzene, toluene and xylene. The organic phase is dehydrated with a dehydrating agent such as calcium chloride, magnesium sulfate or sodium sulfate, and then filtrated with a glass filter or filter paper, followed by removal of the dehydrating agent. Further, the filtrate is filtrated with a membrane filter having a pore size below 1 micron and then distilled under a reduced pressure to remove the solvent and obtain the intended reduced polyvinyl acetal resin. If desired, the resin is purified, for example, by reprecipitation.

The reduction of the polyvinyl acetal resin of formula (1) by the catalytic hydrogenating reduction method (b) using a metal catalyst can be carried out by a conventional manner. As the metal catalyst, there can be mentioned a Ranie-nickel catalyst (R-Ni), a palladium carbon catalyst (Pd/C), a platinum oxide catalyst ($PtO_2$), a copper-chromium oxide catalyst ($CuO.Cr_2O_4$) and a nickel-diatomaceous earth catalyst.

The reducing method (c) using a solution of an alkali metal in an amine is specifically described in the following. As the alkali metal, there can be mentioned sodium and lithium. As the amine, there can be mentioned liquid ammonia, methylamine, ethylamine, dimethylamine, ethylenediamine, propylamine, morpholine and hexamethylphosphoric triamide. Among the alkali metal/amine combinations, a combination of sodium with hexamethylphosphoric triamide is preferable because the reduction treatment is easy and this combination exhibits a strong reducing power.

The manner in which the alkali metal/amine combination is used is not particularly limited, but may be conventional. For example, the method described in G. M. Whitesides and W. J. Ehmann, J. Org. Chem., 35, 3565 (1970) can be employed. In a typical treating manner, a solution of the polyvinyl acetal resin of the formula (1) is added dropwise slowly into a solution of metallic sodium in hexamethylphosphoric triamide at room temperature, or metallic sodium is gradually added into a solution of the polyvinyl acetal resin of the formula (1).

The pellicle film of the present invention can be made by a process wherein a solution of the reduced polyvinyl acetal resin in an organic solvent such as cyclohexanone, ethylene glycol monoethyl ether or ethylene glycol monoethyl ether acetate is prepared, and then the resin solution is coated by using a spin coater on a flat substrate such as silicon wafer to form a uniform film having a thickness of about 1.5 microns, followed by release of the film from the substrate.

The pellicle film of the present invention is characterized as exhibiting a reduced ultraviolet absorption in the vicinity of 365 nm and being durable against irradiation with ultraviolet rays, especially i-line of a mercury arc light, as compared with a pellicle film comprised of an unreduced polyvinyl acetal resin. Therefore, the pellicle film of the invention can be employed in a light exposure apparatus utilizing the i-line as the light source, as well as an apparatus utilizing g-line or h-line of a mercury arc light.

The present invention will now be described in detail with reference to the following examples that by no means limit the scope of the invention.

In the examples, the molar fractions of the vinyl alcohol units and vinyl acetate units in the polyvinyl acetal resin were determined according to JIS (Japanese Industrial Standard) K-6728, and the degree or acetalization was determined by subtracting these molar fractions from the entirety.

SYNTHESIS EXAMPLE 1

Synthesis of Polyvinyl Propional

In 500 ml of a methanol/water (95/5 by weight) mixture was dispersed 50 g of polyvinyl alcohol (completely saponified, average degree of polymerization: 1,000, "PVA-110" supplied by Kuraray). To this dispersion were added 10 ml of an aqueous 35% hydrochloric acid solution and 115.35 g of propionaldehyde, and the resulting mixture was maintained at 55° C. for 96 hours with stirring to effect acetalization. After completion of acetalization, sodium acetate was added to the reaction mixture thereby to be neutralized, the reaction medium was removed by decantation and the precipitated polymer was recovered. The polymer was dissolved in 1.5 liters of acetone and the resulting polymer solution was added dropwise into 8 liters of water to precipitate the polymer. The polymer was vacuum-dried at 40° C. for 48 hours to yield 55 g of polyvinyl propional (PVP-1). The content of vinyl acetate units in PVP-1 was 0.003 and the degree of acetalization of PVP-1 was 0.90. The weight average molecular weight (Mw) of PVP-1 was 145,000 as determined by gel permeation chromatography, and the molecular weight distribution (Mw/Mn) was 2.4.

To evaluate the transparency of PVP-1, a 3% by weight solution of PVP-1 in methylene chloride was prepared and the light absorption and the light transmission were determined by an ultraviolet-visible light spectrophotometer ("UV-260" supplied by Shimadzu Corp.) provided with a quartz cell having an optical path of 1 cm wherein methylene chloride was used as a reference material. The light absorption at 365 nm was 0.05 and the light transmission was 87.8%. The spectral transmission curve of PVP-1 is shown as curve (a) in FIG. 1.

SYNTHESIS EXAMPLE 2

Reduction (1) of Polyvinyl Propional by Using Lithium Aluminum Hydride

In 150 ml of dehydrated and purified tetrahydrofuran (THF) was dissolved 10.0 g of PVP-1 prepared in Synthesis Example 1, and the PVP-1 solution was cooled below 10° C. Separately, 1.0 g of a lithium aluminum hydride (LiAlH$_4$) powder was dispersed in 150 ml of THF, and the LiAlH$_4$ dispersion was added dropwise into the PVP-1 solution at a temperature below 10° C. The resultant mixture was refluxed for 2 hours to effect reduction. To the solution, 50 ml of methanol was added, the mixture was stirred overnight and the reaction medium was removed by vacuum distillation. To the thus-obtained solid, 200 ml of water was added and the mixture was extracted three times with 100 ml of methylene chloride, and the methylene chloride phase was dried with calcium chloride and filtrated by a glass filter and then by a membrane filter having a pore size of one micron. The solvent was removed from the filtrate by vacuum distillation to yield 8.2 g of the intended reduced polyvinyl propional (RVP-1).

The content of vinyl acetate units in RVP-1 was 0.001 and the degree of acetalization of RVP-1 was 0.90. The transparency of RVP-1 was evaluated in the same manner as described in Synthesis Example 1 and it was found that the light absorption was 0.02 and the light transmission was 95.6%. The spectral transmission curve of RVP-1 is shown as curve (b) in FIG. 1.

SYNTHESIS EXAMPLE 3

Reduction (2) of Polyvinyl Propional by Using Lithium Aluminum Hydride

Reduction of PVP-1 was carried out in the same manner as described in Synthesis Example 2 wherein, after the addition of the dispersion of LiAlH$_4$ in THF to the PVP-1 solution, the reaction was carried out at room temperature for 72 hours with all other conditions remaining substantially the same. Thus, 8.0 g of a reduced polyvinyl propional resin (RVP-2) was obtained. The content of vinyl acetate units in RVP-2 was 0.001 and the degree of acetalization of RVP-2 was 0.90. The transparency of RVP-2 was evaluated in the same manner as described in Synthesis Example 1 and it was found that the light absorption was 0.02 and the light transmission was 95.2%. The spectral transmission curve of RVP-2 is shown as curve (c) in FIG. 1.

SYNTHESIS EXAMPLE 4

Reduction (3) of Polyvinyl Propional by Using Lithium Aluminum Hydride

Reduction of PVP-1 was carried out in the same manner as described in Synthesis Example 2 wherein di-n-propyl ether was used instead of THF and the reducing reaction was carried out for 72 hours under reflux with all other conditions remaining substantially the same. Thus, 8.3 g of a reduced polyvinyl propional resin (RVP-3) was obtained. The content of vinyl acetate units in RVP-3 was 0.001 and the degree of acetalization of RVP-3 was 0.90. The transparency of RVP-3 was evaluated in the same manner as described in Synthesis Example 1 and it was found that the light absorpiton was 0.02 and the light transmission was 95.3%. The spectral transmission curve of RVP-3 is shown as curve (d) in FIG. 1.

SYNTHESIS EXAMPLE 5

Reduction of Polyvinyl Propional by Using Sodium Aluminum Hydroxide

Figure 2:
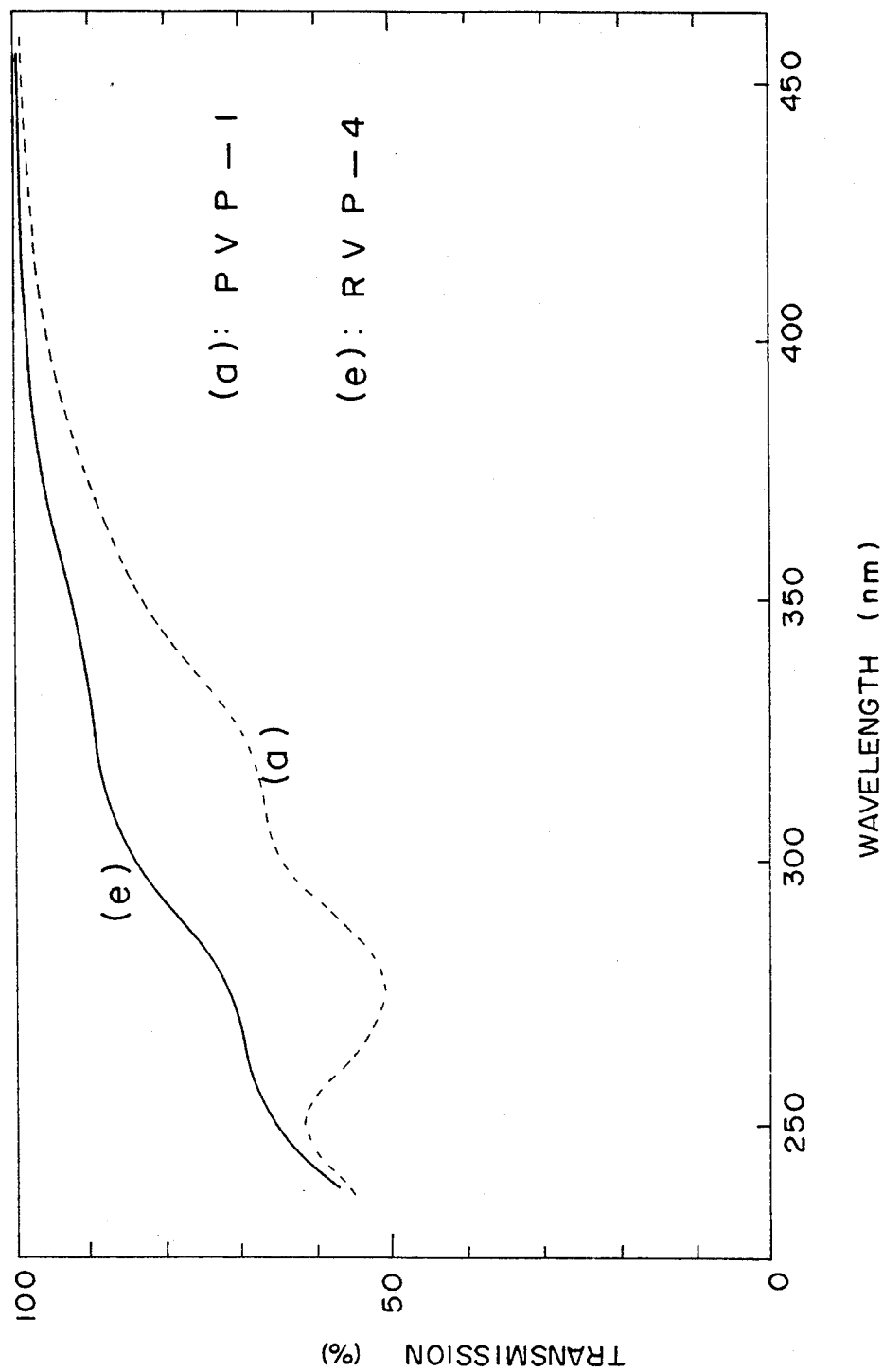
FIG. 2 shows an ultraviolet transmission of a reduced polyvinyl propional prepared in Synthesis Example 5 and that of an untreated polyvinyl propional resin prepared in Synthesis Example 1.

Reduction of PVP-1 was carried out in the same manner as described in Synthesis Example 2 wherein 1.4 g of sodium aluminum hydride (NaAlH$_4$) was used instead of 1.0 g of lithium aluminum hydride with all other conditions remaining substantially the same. Thus, 8.3 g of a reduced polyvinyl propional (RVP-4). The content of vinyl acetate units in RVP-4 was 0.001 and the degree of acetalization of RVP-4 was 0.90. The transparency of RVP-4 was evaluated in the same manner as described in Synthesis Example 1 and it was found that the light absorption was 0.02 and the light transmission was 94.4%. The spectral transmission curve of RVP-4 is shown as curve (e) together with curve (a) of PVP-1 in FIG. 2.

SYNTHESIS EXAMPLE 6

Synthesis of Polyvinyl Butyral

In 500 ml of methanol/water (95/5 by weight) mixture was dispersed 50 g of polyvinyl alcohol (completely saponified, average degree of polymerization: 1,000, "PVA-110" supplied by Kuraray). To this dispersion were added 10 ml Of an aqueous 35% hydrochloric acid solution and 140.25 g of butyl aldehyde, and the resulting mixture was maintained at 55° C. for 96 hours with stirring to effect acetalization. After completion of acetalization, sodium acetate was added to the reaction mixture thereby to be neutralized, the reaction medium was removed by decantation and the precipitated polymer was recovered. The polymer was dissolved in 1.5 liters of acetone and the resulting polymer solution was added dropwise into 8 liters of water to precipitate the polymer. The polymer was vacuum-dried at 40° C. for 48 hours to yield 54 g of polyvinyl butyral (PVB-1). The content of vinyl acetate units in PVB-1 was 0.009 and the degree of acetalization of PVB-1 was 0.79. The weight average molecular weight (Mw) of PVB-1 was 162,000 as determined by gel permiation chlomatography, and the molecular weight distribution (Mw/Mn) was 2.6.

Figure 3:
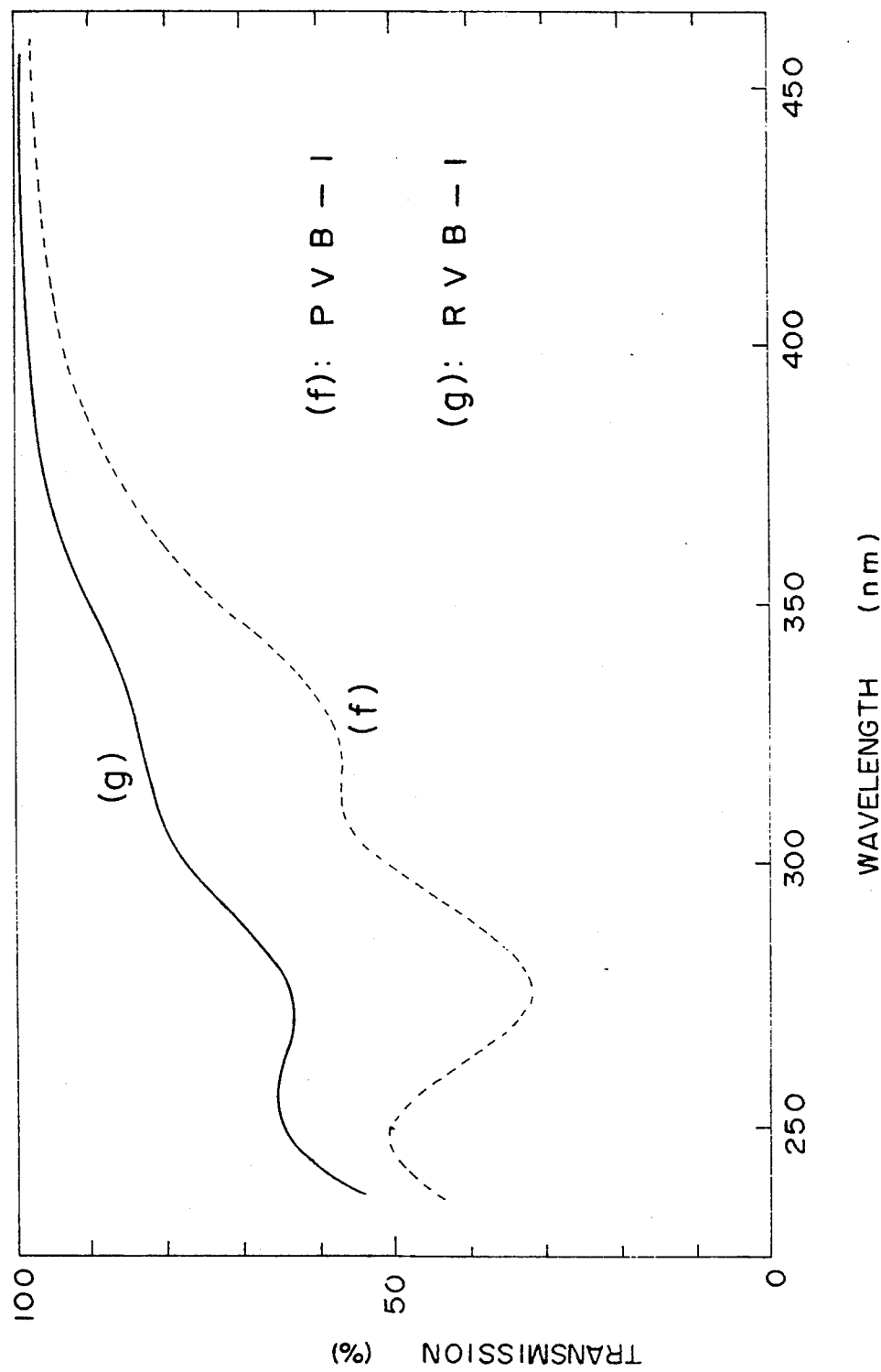
FIG. 3 shows an ultraviolet transmission of a reduced polyvinyl butyral resin prepared in Synthesis Example 7 and that of an untreated polyvinyl butyral resin prepared in Synthesis Example 6.

To evaluate the transparency of PVB-1, a 3% by weight solution of PVB-1 in methylene chloride was prepared and the light absorption and the light transmission were determined by an ultraviolet-visible light spectrophotometer ("UV-260" supplied by Shimadzu Corp.) with a quartz cell having an optical path of 1 cm wherein methylene chloride was used as a reference material. The light absorption at 365 nm was 0.08 and the light transmission was 82.6%. The spectral transmission curve of PVB-1 is shown as curve (f) in FIG. 3.

SYNTHESIS EXAMPLE 7

Reduction of Polyvinyl Butyral by Using Lithium Aluminum Hydride

Reduction of 10 g of PVB-1 prepared in Synthesis Example 6 was carried out by using LiAlH$_4$ in the same manner as described in Synthesis Example 2 to yield 7.8 g of a reduced polyvinyl butyral resin (RVB-1). The content of vinyl acetate units in RVB-1 was 0.002 and the degree of acetalization of RVB-1 was 0.79. The transparency of RVB-1 was evaluated in the same manner as described in Synthesis Example 1 and it was found that the light absorption was 0.02 and the light transmission was 95.6%. The spectral transmission curve of RVB-1 is shown as curve (g) together with curve (f) of PVB-1 in FIG. 3.

SYNTHESIS EXAMPLE 8

Catalytic Hydrogenating Reduction of Polyvinyl Propional by Using Ranie-Nickel Catalyst In 1,000 ml of thoroughly dried 1,4-dioxane was dissolved 80 g of PVP-1 prepared in Synthesis Example 1, and the entire mixture was charged in a two liter stainless steel autoclave provided with a stirrer. Separately, a Ranie-nickel W-2 catalyst was newly developed and the solvent thereof was substituted by 1,4-dioxane, and 16 g of the thus-treated catalyst was added into the PVP-1 charged autoclave. After the autoclave was closed, a high-purity hydrogen gas was introduced into the autoclave and the content was then maintained at 90° C. under a hydrogen pressure of 60 kg/cm$^2$ for 8 hours with stirring. It was found that about 0.3 liter of hydrogen gas was consumed and thereafter the consumption of hydrogen gas became saturated. The thus-prepared reduction product was restored to the normal state (i.e., room temperature and normal pressure) and filtrated by using a Celite filter medium, and the filtrate was filtrated by a membrane filter having a pore size of 0.1 micron whereby the catalyst was completely removed. The thus-obtained filtrate was added dropwise into 10 liters of water under vigorous agitation to precipitate a polymer. The polymer was washed repeatedly with water and then vacuum-dried at 40° C. for 48 hours to yield 72 g of a reduced polyvinyl propional (RVP-5). The content of vinyl acetate units in RVP-5 was 0.002 and the degree of acetalization of RVP-5 was 0.90.

Figure 4:
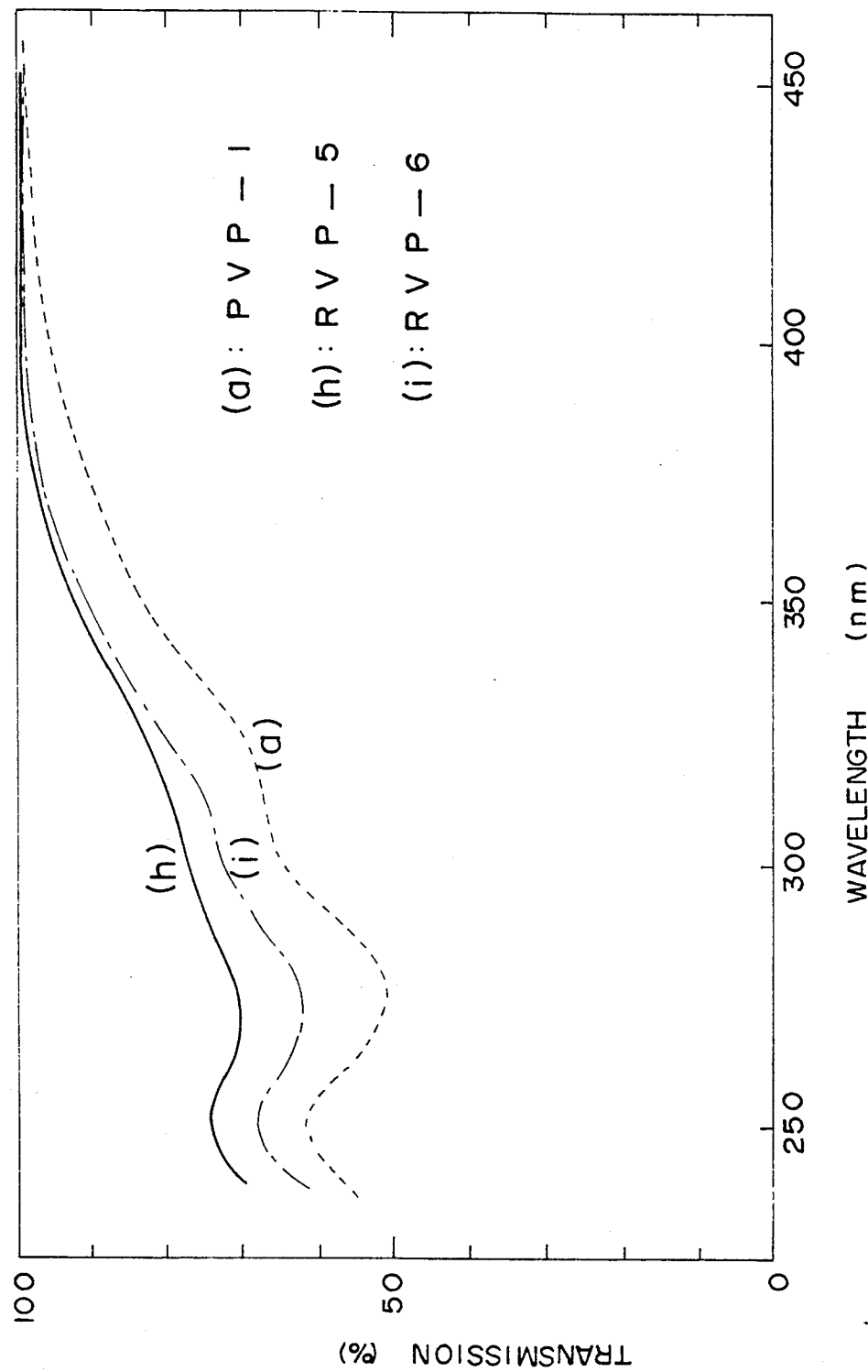
FIG. 4 shows ultraviolet transmissions of reduced polyvinyl propional resins prepared in Synthesis Examples 8 and 9, and that of an untreated polyvinyl propional resin prepared in Synthesis Example 1.

The transparency of RVP-5 was evaluated in the same manner as described in Synthesis Example 1 and it was found that the light absorption was 0.02 and the light transmission was 96.2%. The spectral transmission curve of RVP-5 is shown as curve (h) together with curve (a) of PVP-1 in FIG. 4.

SYNTHESIS EXAMPLE 9

Catalytic Hydrogenating Reduction of Polyvinyl Propional by Using Palladium Carbon Catalyst In 1,250 ml of throughly dried ethylene glycol monoethyl ether was dissolved 100 g of PVP-1 prepared in Synthesis Example 1, and the entire mixture was charged in a two liter stainless steel autoclave provided with a stirrer. Into the PVP-1 charged autoclave, was incorporated 20 g of 10% palladium carbon. After the autoclave was closed, a high-purity hydrogen gas was introduced into the autoclave and the content was maintained at room temperature under a hydrogen pressure of 80 kg/cm$^2$ for 8 hours with stirring. It was found that about 0.5 liter of hydrogen gas was consumed and thereafter the consumption of hydrogen gas became saturated. The thus-prepared reduction product was filtered by using a Celite filter medium and the filtrate was filtered by a membrane filter having a pore size of 0.1 micron whereby the catalyst was completely removed. The thus-obtained filtrate was added dropwise into 10 liters of water under vigorous agitation to precipitate a polymer. The polymer was repeatedly washed with water and then vacuum-dried at 40° C. for 48 hours to yield 89 g of a reduced polyvinyl propional (RVP-6). The content of vinyl acetate units in RVP-6 was 0.002 and the degree of acetalization of RVP-6 was 0.90.

The transparency of RVP-6 was evaluated in the same manner as described in Synthesis Example 1 and it was found that the light absorption was 0.02 and the light transmission was 94.8%. The spectral transmission curve of RVP-6 is shown as curve (i) together with curve (a) of PVP-1 in FIG. 4.

SYNTHESIS EXAMPLE 10

Reduction of Polyvinyl Propional by Using Solution of Metallic Sodium in Hexamethylphosphoric Triamide A two liter four-necked flask provided with a stirrer, a condenser, a gas-introducing tube and a dropping funnel was charged with 1,000 ml of thoroughly dried hexamethylphosphoric triamide, and the content was stirred while dry nitrogen gas was introduced above the liquid surface. Into the flask, 5 g of metallic sodium was gradually added and the liquid mixture was thoroughly stirred at room temperature until the liquid became deep blue to prepare a solution of metallic sodium in hexamethylphosphoric triamide. Separately, 50 g of PVP-1 prepared in Synthesis Example 1 was dissolved in 500 ml of thoroughly purified and dried dioxane, and the thus-prepared PVP-1 solution was added dropwise through the dropping funnel into the metallic sodium solution in hexamethylphosphoric triamide at room temperature over a period of 4 hours. After the dropping addition, the mixture was maintained at room temperature for 16 hours to continue the reduction reaction, and then 100 ml of ethylene glycol monoethyl ether was added to the reaction mixture. The reaction mixture was added dropwise into 4 liters of water to precipitate a polymer. The polymer was repeatedly washed with water and then vacuum-dried at 40° C. for 48 hours to yield 45 g of a reduced polyvinyl propional (RVP-7). The content of vinyl acetate units in RVP-7 was 0.001 and the degree of acetalization of RVP7 was 0.90.

Figure 5:
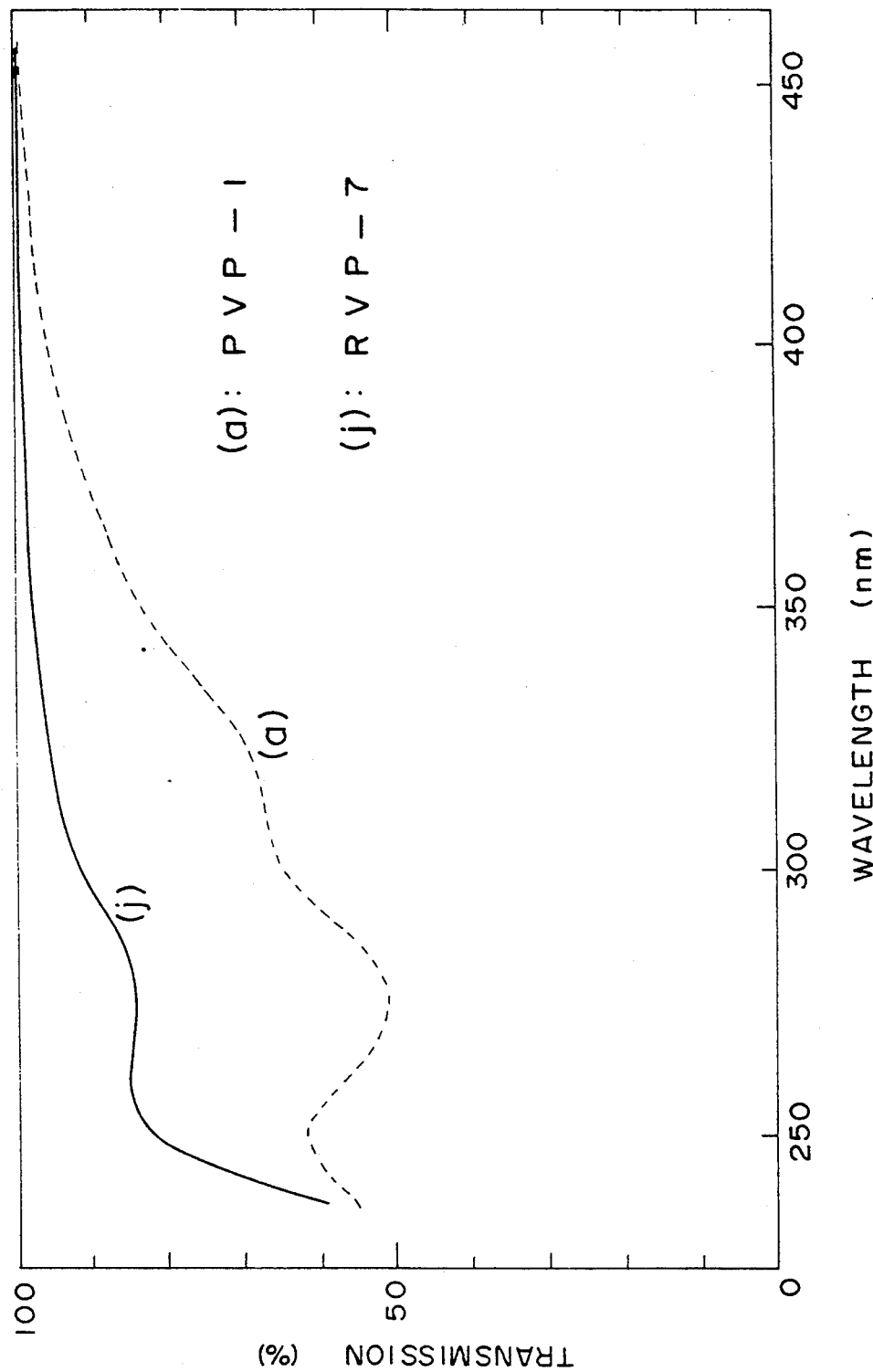
FIG. 5 shows an ultraviolet transmission of a reduced polyvinyl propional resin prepared in Synthesis Example 10 and that of an untreated polyvinyl propional resin prepared in Example 1.

To evaluate the transparency of RVP-7, a 3% by weight solution of RVP-7 in methylene chloride was prepared and the light absorption and the light transmission were determined by an ultraviolet-visible light spectrophotometer in the same manner as described in Synthesis Example 1. The light absorption at 365 nm was 0.01 and the light transmission was 98.8%. Thus, the transparency of RVP-7 was highly enhanced as compared with that of unreduced polyvinyl propional (PVP-1). The spectral transmission curve of RVP-7 is shown as curve (j) together with curve (a) of PVP-1 in FIG. 5.

EXAMPLE 1

In 290 g of cyclohexanone was dissolved 30 g of the reduced polyvinyl propional (RVP-1) prepared in Synthesis Example 2. The RVP-1 solution was spin-coated on a silicon wafer having a diameter of 6 inches by using a spin-coater at a revolution of 3,000/min and then vacuum-dried to form a film having a thickness of 1.5 microns on the silicon wafer. The film was separated from the wafer to give a pellicle film.

The ultraviolet transmission of the pellicle film at 365 nm was measured by using an ultraviolet-visible light spectrophotometer ("UV-260" supplied by Shimadzu Corp.) without any control light flux. The UV transmission was 99.9%.

The pellicle film was exposed to monochromatic light (i-line illuminance: 30.41 mW/cm$^2$) of 365 nm from an ultra-high-pressure mercury lamp ("Multilight ML-501D/B" supplied by Ushio Electric Co.) over a period of 1,500 hours. When this exposed dose is converted into light exposing times on the reticle surface of an i-line stepper, it equals to the dose of 20,000,000 shots. The i-line dose is hereinafter expressed by the number of shots. After the UV exposure, the UV transmission at 365 nm was measured in the same manner as described above. The UV transmission was 99.9%. Thus, the UV transmission of the pellicle film at 365 nm was not reduced by the exposure to the i-line.

EXAMPLE 2

A pellicle film was made from the reduced polyvinyl propional (RVP-2) prepared in Synthesis Example 3, by a procedure similar to that employed in Example 1. The UV transmission at 365 nm of the pellicle film, determined in the same manner as described in Example 1, was 99.9%.

The pellicle film was exposed to i-line of a mercury arc light at a dose of about 20,000,000 shots in the same manner as described in Example 1. The UV transmission at 365 nm of the pellicle film was not reduced by the i-line exposure.

EXAMPLE 3

A pellicle film was made from the reduced polyvinyl propional (RVP-3) prepared in Synthesis Example 4, by a procedure similar to that employed in Example 1. The UV transmission at 365 nm of the pellicle film, determined in the same manner as described in Example 1, was 99.9%.

The pellicle film was exposed to i-line of a mercury arc light at a dose of about 20,000,000 shots in the same manner as described in Example 1. The UV transmission at 365 nm of the pellicle film was not reduced by the i-line exposure.

EXAMPLE 4

A pellicle film was made from the reduced polyvinyl propional (RVP-4) prepared in Synthesis Example 5, by a procedure similar to that employed in Example 1. The UV transmission at 365 nm of the pellicle film, determined in the same manner as described in Example 1, was 99.9%.

The pellicle film was exposed to i-line of a mercury arc light at a dose of about 20,000,000 shots in the same manner as described in Example 1. The UV transmission at 365 nm of the pellicle film was not reduced by the i-line exposure.

EXAMPLE 5

A pellicle film was made from the reduced polyvinyl butyral (RVB-1) prepared in Synthesis Example 7, by a procedure similar to that employed in Example 1. The UV transmission at 365 nm of the pellicle film, determined in the same manner as described in Example 1, was 99.9%.

The pellicle film was exposed to i-line of a mercury arc light at a dose of about 20,000,000 shots in the same manner as described in Example 1. The UV transmission at 365 nm of the pellicle film was not reduced by the i-line exposure.

EXAMPLE 6

A pellicle film was made from the reduced polyvinyl propional (RVP-5) prepared in Synthesis Example 8, by a procedure similar to that employed in Example 1. The UV transmission at 365 nm of the pellicle film, determined in the same manner as described in Example 1, was 99.9%.

The pellicle film was exposed to i-line of a mercury arc light at a dose of about 20,000,000 shots in the same manner as described in Example 1. The UV transmission at 365 nm of the pellicle film was not reduced by the i-line exposure.

EXAMPLE 7

A pellicle film was made from the reduced polyvinyl propional (RVP-6) prepared in Synthesis Example 9, by a procedure similar to that employed in Example 1. The UV transmission at 365 nm of the pellicle film, determined in the same manner as described in Example 1, was 99.9%.

The pellicle film was exposed to i-line of a mercury arc light at a dose of about 20,000,000 shots in the same manner as described in Example 1. The UV transmission at 365 nm of the pellicle film was not reduced by the i-line exposure.

EXAMPLE 8

A pellicle film was made from the reduced polyvinyl propional (RVP-7) prepared in Synthesis Example 10, by a procedure similar to that employed in Example 1. The UV transmission at 365 nm of the pellicle film, determined in the same manner as described in Example 1, was 99.9%.

The pellicle film was exposed to i-line of a mercury arc light at a dose of about 20,000,000 shots in the same manner as described in Example 1. The UV transmission at 365 nm of the pellicle film was not reduced by the i-line exposure.

COMPARATIVE EXAMPLE 1

A pellicle film was made from the polyvinyl propional (PVP-1), which was prepared in Synthesis Example 1 and was not subjected to a reduction treatment, by a procedure similar to that employed in Example 1. The UV transmission at 365 nm of the pellicle film was 99.9%.

The pellicle film was exposed to i-line of a mercury arc light in the same manner as described in Example 1 and, when the dose reached about 10,000,000 shots, the UV transmission at 365 nm of the pellicle film was reduced to 99.0%, i.e., the pellicle became of no practical use.

COMPARATIVE EXAMPLE 2

A pellicle film was made from the polyvinyl butyral (PVB-1), which was prepared in Synthesis Example 6 and was not subjected to a reduction treatment, by a procedure similar to that employed in Example 1. The UV transmission at 365 nm of the pellicle film was 99.9%.

The pellicle film was exposed to i-line of a mercury arc light in the same manner as described in Example 1 and, when the dose reached about 7,500,000 shots, the transmission at 365 nm of the pellicle film was reduced to 99.0%, i.e., the pellicle became of no practical use.

What is claimed is:

1. A film for a pellicle consisting essentially of a resin prepared by treating with a reducing agent a polyvinyl acetal resin represented by the following formula (1):

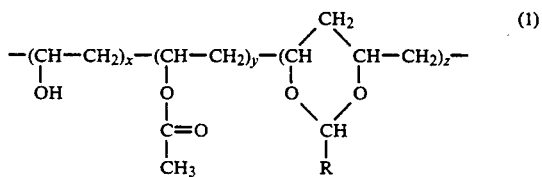

wherein R is a linear or branched alkyl group having 1 to 3 carbon atoms, and x, y and z are numbers such that the content of the vinyl acetate units, expressed by $y/(x+y+z)$, is not larger than 0.1 and the degree of acetalization, expressed by $z/(x+y+z)$, is at least 0.6.

2. A film for a pellicle according to claim 1, wherein the reduction of the polyvinyl acetal is effected by using lithium aluminum hydride.

3. A film for a pellicle according to claim 1, wherein the reduction of the polyvinyl acetal is effected by catalytic hydrogenation reduction using a Ranie-nickel catalyst.

4. A film for a pellicle according to claim 1, wherein the reduction of the polyvinyl acetal is effected by catalytic hydrogenation reduction using a palladium carbon catalyst.

5. A film for a pellicle according to claim 1, wherein the reduction of the polyvinyl acetal is effected by using a solution of metallic sodium in hexamethylphosphoric triamide.

* * * * *